US005633812A

United States Patent [19]
Allen et al.

[11] Patent Number: 5,633,812
[45] Date of Patent: May 27, 1997

[54] FAULT SIMULATION OF TESTING FOR BOARD CIRCUIT FAILURES

[75] Inventors: James S. Allen, Friendswood, Tex.; Theresa L. Meyer, Endicott, N.Y.; Kenneth D. Wagner, Columbia, Md.

[73] Assignee: International Business Machines Corporation, Armonk, N.Y.

[21] Appl. No.: 953,396

[22] Filed: Sep. 29, 1992

[51] Int. Cl.$^6$ .................................................. G06F 11/00
[52] U.S. Cl. ...................................... 364/578; 395/183.09
[58] Field of Search ............................. 371/23, 25.1, 26, 371/27, 29.1; 364/579, 578, 488, 489, 490, 491; 324/73.1, 158 R

[56] References Cited

U.S. PATENT DOCUMENTS

| | | | |
|---|---|---|---|
| 3,790,767 | 2/1974 | Alexander | 364/579 |
| 4,695,968 | 9/1987 | Sullivan et al. | 364/578 |
| 4,725,971 | 2/1988 | Doshi et al. | 364/578 |
| 4,727,545 | 2/1988 | Glackemeyer et al. | 371/23 |
| 4,759,019 | 7/1988 | Bentley et al. | 371/23 |
| 4,868,770 | 9/1989 | Smith et al. | 364/200 |
| 4,901,260 | 2/1990 | Lubachevsky | 364/578 |
| 4,922,445 | 5/1990 | Mizoue et al. | 364/578 |
| 4,961,156 | 10/1990 | Takasaki | 364/578 |
| 5,018,089 | 5/1991 | Kanazawa | 364/578 |
| 5,043,910 | 8/1991 | Chiba | 364/489 |
| 5,051,938 | 9/1991 | Hyduke | 364/578 |
| 5,095,454 | 3/1992 | Huang | 371/23 X |
| 5,127,006 | 6/1992 | Subramanian et al. | 371/23 X |
| 5,202,889 | 4/1993 | Aharon et al. | 364/578 X |
| 5,214,577 | 5/1993 | Sztipanovits et al. | 371/23 |
| 5,255,208 | 10/1993 | Thakore et al. | 371/29.1 X |
| 5,272,651 | 12/1993 | Bush et al. | 364/578 |

OTHER PUBLICATIONS

IBM Tech. Disc. Bulletin vol. 34 No. 4A Sep. 1991 pp. 292–294 "Distributed Trace–A Facility to Trace Data and Code Flows in a Requester/Server Environment".

IBM Tech. disc. Bulletin vol. 16 No. 4 Sep. 1973 pp. 1241–1242 "Interactive Simulation Language".

IBM Tech. Disc. Bulletin vol. 17 No. 7 Dec. 1974 pp. 2032–2033 "Automated Test with Interface Verification Simulation".

1989 Int. Test Conference, "CAE Functionality for Verification of Diagnostic Programs" pp. 94–102.

1988 Int. Test Conf. "Experiences with Concurrent Fault Simulation of Diagnostic Programs" pp. 877–883.

*Primary Examiner*—Emanuel T. Voeltz
*Assistant Examiner*—Eric B. Stamber
*Attorney, Agent, or Firm*—William H. Steinberg; Eugene I. Shkurko

[57] ABSTRACT

A method of accurately simulating how design defects and faults are detected in the board design and manufacturing test environments is provided which uses statements in the simulation control language of a fault simulator. The simulation of the operation of electronic boards (which may not yet have been built) in their expected test environments is possible. The set of statements used in the simulation language allows the proposed functional self-test code, also called diagnostic code or power-on self-test code, which is to be executed by a (micro-)processor, to be tested for its effectiveness. The simulation must synchronize the simulated execution of the processor code to be evaluated with the fault detection by the code being evaluated, simulate the use of any attached tester, such as a logic analyzer, and provide data that can be used for programming devices in the test environment. The PROBE statements in the simulation language determine when the simulator starts and ends a measurement window during which faults can be detected by the simulator. These statements can be used to simulate the amount of time a net must remain stable for test equipment to capture its value.

8 Claims, 10 Drawing Sheets

FIG.1

(D) SIMULATION CONTROL STATEMENTS NEEDED:

```
DEFINE PROBE1 SETUP(x) HOLD(y) ATTACH_TO(DATA);
    WHEN (TRIGGER = `F`B);          /* FALLING EDGE ON TRIGGER */
    WHEN (CLOCK = `R`B) COUNT(2);   /* WAIT 2 ADDITION CLOCK EDGES */
    WHEN OFFSET(z);                 /* DELAY z TIME UNITS */
END PROBE;
  •
  •
  •
PROBE PROBE1;
```

FAULT SIMULATION OF TESTING FOR BOARD CIRCUIT FAILURES

BACKGROUND OF THE INVENTION

The present invention relates to simulation of fault-free and fault conditions of a circuit for evaluating circuit testing methods.

Over the past decade tremendous advances have been achieved in integrated circuit densities and the amount of logic that can be placed on a single integrated circuit chip. Accompanying these advances have been a series of improvements, albeit less dramatic ones, in the realm of printed circuit board (PCB) manufacture. Integrated circuit chip packaging techniques have been evolving constantly, with the goal of permitting more input/output pins on the chip package, and to allow an increasing number of chip packages to be mounted on a given board. As with chips, printed circuit boards contain far more logic today than they did 10 years ago. It is not uncommon today to squeeze all the logic for a powerful (even by today's standards) computer onto a PCB the size of a sheet of notebook paper.

One problem that results from the ever increasing density of chips and boards is the increased difficulty of test. As these entities become ever more dense, the task of determining whether or not they contain manufacturing or design defects becomes ever more difficult. Effective solutions to the problem may include several approaches, including the addition of logic to the design that is dedicated to test, and the use of sophisticated test equipment that provides improved visibility into the manufactured product. These approaches, while providing enhanced detection and diagnosis of design or manufacturing induced failures, are typically non-functional in nature. For printed circuit boards in particular, it is also desirable to perform a functional test prior to installing them in the final product. This functional test refers to operating the design in a manner that is consistent with how it will be operated in the final product by the end user. For instance, a central processing unit (CPU or, most commonly today, a microprocessor) would fetch instructions from memory, execute those instructions, and then perform a program to exercise the various subsystems that reside on the board. This type of test is a functional self-test (FST), since the product is testing itself in a functional mode.

One characteristic of FST that distinguishes it from other types of testing is that no external test equipment is being used to apply test vectors to the product. Typically, most printed circuit boards today undergo an in-circuit test, where a bed-of-nails test fixture is used to apply pre-computed test vectors to various points on the board. In this type of test, the vectors are stored in the tester and applied at a regular frequency until they have been exhausted. Likewise, the test equipment will be performing measurements at various points on the board at the same frequency. In a functional self-test, the test program is stored in ROM on the board itself, and the application of the test stimulus is via a microprocessor executing the program. Detection of defects occurs by the microprocessor interpreting the results of the executing program. It is key to note that defects occur at points in the program where the microprocessor is comparing expected results to actual results.

Regardless of the type of test being performed on the board (or chip or any product, for that matter), it is valuable to know the quality of the test. That is, what percentage of the potential defects will be exposed by the application of the test. We call this number test coverage. Obviously the higher the test coverage, the better; with 100% being the ultimate goal. A higher test coverage means a decreased chance that defective product will be delivered to the customer. Sometimes, particularly for chips and modules, a technique known as fault simulation is used to determine the test coverage number. This technique utilizes a simulation of the logic design, contained in software, wherein potential defects, or faults, are injected into the design and simulated in conjunction with the test stimuli to determine whether or not they are detected. The software program used to perform this analysis is called a fault simulator. Historically, there has been significant use of fault simulation for chip designs, but very limited use for printed circuit boards. Determination of test coverage for boards, if done at all, has tended to rely on manual insertion of faults onto a known good board.

There are several reasons for having to rely on the manual insertion of faults onto a known good board. The amount of logic contained on a printed circuit board is many times that contained on a single chip, since a PCB is composed of many chips. Fault simulation is an inherently compute intensive, time consuming task, thus frequently making the fault simulation of an entire PCB impractical. With ever more powerful computers, improved algorithms and new modelling techniques, these limitations are slowly giving way. Fault simulation of PCBs is still very time consuming, but has become possible with some constraints applied.

It has often been impossible to obtain software models of all the components that comprise a PCB. Most PCBs contain several off-the-shelf components for which the internal logic design is unavailable, often due to the fact that it is proprietary information of the manufacturer. Generating a software model for these components can be difficult and often impractical. Without such a model for every PCB component, a fault simulation is not very useful.

Today, there are companies whose sole business is the production of software models for a wide range of commercially available components. In addition, the advent of hardware modeling, wherein the actual component itself serves as a simulation model, has done much to relieve the problem. Dynamic hardware modellers, such as the series from Logic Modeling Corporation, can effectively support board fault simulation. Today, with some significant effort, one can typically find some means of constructing a complete model set for most PCBs.

Fault simulation has often been coupled with some form of automatic test generation. An automatic test generator (ATG) program develops test patterns to be applied to the unit under test, with the goal of achieving a high test coverage. The fault simulator grades the test patterns produced by the ATG, and indicates the test coverage. ATG programs can only function effectively on designs that have built-in testability structures (e.g., level sensitive scan design). While it is not uncommon for complex chips to have such structures, it is very unusual for an entire PCB to be designed in such a fashion. Thus the use of non-functional testing techniques, and the associated fault simulation, has been very limited at the board level.

This trend continues to be true today. Automatic test generation for general sequential circuitry remains poor, thus non-functional through-the-pins test of PCBs remains rare. There is a recently defined standard, IEEE 1149.1, that defines a set of testability structures and protocols, as boundary-scan, that does address non-functional testing at the board level. This type of testing should become more common over the next few years.

It is an object of the present invention to provide an apparatus and a method to determine the effectiveness of the test environment including devices external to the circuits under test such as logic analyzers and digital testers as well as devices contained in the circuits under test such as functional self-test code using fault simulation.

It is another object of the present invention to provide an apparatus and a method to determine the effectiveness of functional self-test code at detecting defects in populated printed circuit boards or printed circuit board designs using fault simulation.

It is yet another object of the present invention to provide apparatus and a method to predict circuit responses at monitoring points appropriate to the action and programming of the tester and other test conditions under fault-free and faulty conditions of the circuits under test using fault simulation.

It is a further object of the present invention to provide diagnostic data from the simulation of field testing procedures for use in failure isolation and circuit replacement in the field.

It is a still further object of the present invention to provide data that can be used for programming devices in the test environment.

SUMMARY OF THE INVENTION

In one aspect of the present invention a method and apparatus for simulating the detection of faults in a circuit is provided. A logical probe for determining the nets to be measured, the conditions to be satisfied before the measurement can be made, and for generating data used to program devices in the test environment is supplied. The operation of the circuits for fault-free and faulty operation is simulated. The occurrence of the defined conditions to be satisfied before measurement can be made is monitored for and the net values are measured upon the occurrence of the defined conditions during fault-free and faulty operation of the circuit. The fault-free value and the faults which can be detected are recorded so that the effectiveness of the logical probe in detecting fault conditions can be determined.

In another aspect of the present invention a method and apparatus are provided for simulating the detection of faults in a circuit having functional self test code run by a processor in the circuit. A logical probe for determining the nets to be measured, the conditions to be satisfied before the measurement can be made, and for generating data used to program devices in the test environment is supplied. The operation of the circuit including the operation of the self test code is simulated for fault-free and a plurality of fault conditions. The occurrence of the defined conditions to be satisfied before measurement can be made is monitored for and the net value measured upon the occurrence of the defined conditions during fault-free and faulty operation of the circuit. The fault-free net value is compared to the net values detected for each of the faults simulated. The fault-free value is recorded as well as the values different from the fault-free value together with the corresponding fault, so that the effectiveness of the functional self test code in detecting fault conditions can be determined.

Applications of the present invention include design verification, manufacturing test, and field test. In each application, the test environment or circuitry controlling and monitoring the network being fault simulated must be accurately reproduced.

DETAILED DESCRIPTION OF THE INVENTION

Testing of electronic circuit boards requires the development of test patterns. It is common to test boards that contain or are driven by a microprocessor with functional self-test (FST) code, also called diagnostic code, POST (Power-On Self-Test) code, etc. The processor executes this microcode, testing specified functional behavior of the board at its normal operating speed. To evaluate the efficiency of FST code relative to a particular test configuration, fault simulation is performed.

To evaluate the utility of FST code and the test environment during the fault simulation, it is critical to properly reflect when and where design or physical faults are detected during design verification, manufacturing test, or field test. Then accurate diagnostics and measures of fault coverage can be produced by the simulator.

The present invention provides a set of statements in the simulation control language of a fault simulator that provide it with the information necessary to accurately simulate how fault detection is performed in the board manufacturing test environment. The syntax includes separate tags to identify data in the statements which can be used to program the tester or logic analyzer.

A logical probe is used to specify when and where faults can be detected during the simulation. Nets are assigned to a probe and specified trigger conditions are defined that tell the simulator when faults may be detected on these nets. The probe support is set up for use with three testing methods, functional self-test, test and logic analyzer, and stored pattern testing.

Figure 1:
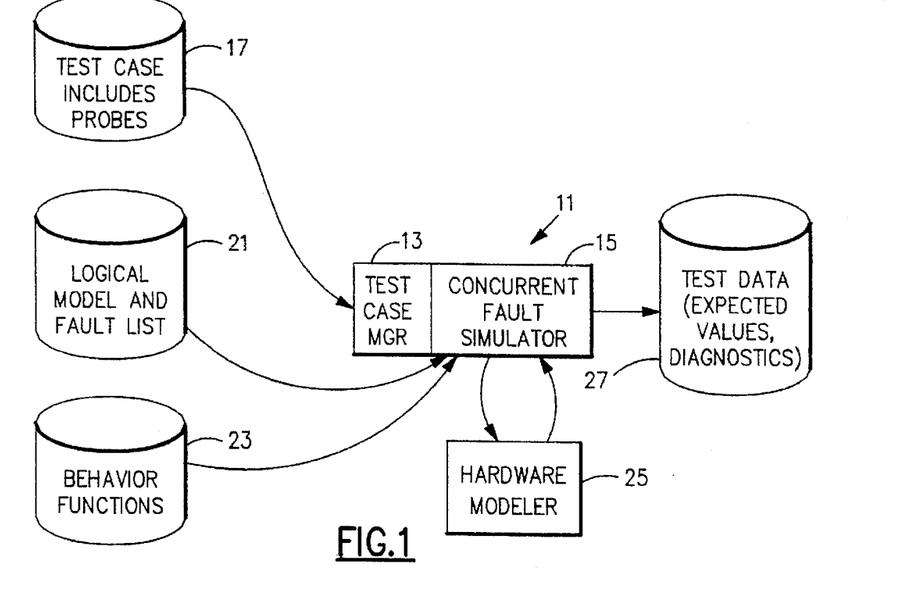
FIG. 1 is a block diagram representation of a fault simulator system for simulating fault detection in circuits under test in accordance with the present invention.

Referring now to the Figures wherein like numerals indicate like elements throughout and particularly FIG. 1 thereof, a block diagram of a fault simulator system is shown. The simulator 11 which can run on a RISC System 6000 computer available from IBM and includes a test case manager 13 and concurrent fault simulator 15, receives a program called test case 17 which controls the simulator 11. The test case program 17 contains initial values, logical probe definitions and probe activation statements.

A logical model 21, which is loaded into the software simulator 11 contains the interconnection information for the circuits under test as well as the fault list which determines the fault conditions which are to be simulated. The circuits under test can comprise digital circuits which encompass several printed circuit boards or can be confined to a single printed circuit board or a fraction thereof. A behavior file 23 contains the functions of the components that are interconnected including the behavior of ROM chips that can contain the FST code. A dynamic hardware modeler 25, such as the LM family of hardware modelers from Logic Modeling Corporation, which contains an interface for connecting hardware models of chips or boards to the simulator can be used to simulate a portion of the circuits under test. The output of the simulator system is provided to a file 27 which contains the fault-free value at each of the nets probed when the required conditions for making a measurement were satisfied together with the detectable faults of the faults that were simulated.

When using functional self-test code, observation (and hence defect detection) may be limited to signals that the processor can access, such as the system data bus. It may take many system clock cycles (or may not be possible) to propagate the effect of failures elsewhere on the board to the processor. To compensate for this difficulty of observation, instruments may be added in the test environment to monitor selected board nets not available to the processor, accelerating failure detection and simplifying test code.

Many test methods exist to control the processor address space or buses including in-circuit emulation (ICE), bus emulation, ROM emulation, and on-board test code. Functional self-test, therefore includes an on-board (or off-board) processor executing test code to verify correct operation of the board-under-test. The processor applies the stimulus, observes the response, compares with the expected value(s), and acts on any errors.

---

Test code blocks resemble:
(known board state)
...
DO <Operation n>
COMPARE <Response with Predicted Value>
BRANCH ON CONDITION <Not Equal>
    TO ERROR HANDLER(n)
...

---

Testers and logic analyzers provide sampling and comparison of data independent of the microprocessor. The use of tester or tester-like instruments require attaching physical probes to a selected set of board interconnections. Like the previous method, the test stimulus is provided by executing FST code at the microprocessor. This test method may be combined with the previous one to improve fault detection capability.

Stored pattern testing provides control and observation of board activity by the tester only, accessing the board edge connectors and perhaps some internal test points. The tester clock rate determines the maximum pattern application rate.

Simulation Control Language Statements

Define Probe

This statement defines a logical probe that is attached to a set of nets and is triggered by (defect-free) conditions in the simulation. It defines the beginning of a group (similar to DO-END).

When

Defines a specific trigger condition to be satisfied for this logical probe. It is only valid within a DEFINE PROBE group. There may be multiple WHEN statements for each group that will be satisfied in the order they are written.

End Probe

Marks the end of the DEFINE PROBE group.

Probe

This statement tells the simulator to activate a specific logical probe and begin monitoring for the trigger conditions that activate it.

Statement Syntax

Define Probe Command

The DEFINE PROBE creates a logical probe used to measure the state of the circuit and detect faults. It may be followed by 1 or more WHEN statements that specify conditions that must be satisfied before the actual measurement takes place.

DEFINE probe_name PROBE SETUP(num1) HOLD
    (num2) ATTACH_TO(list_item[,list_item ... ]);

where:

probe_name is the name assigned to the logical probe. It has the same format as a net name (1–32 alphanumeric characters beginning with an alphabetic or any 1–32 characters enclosed in quotes).

num1 is the number of simulation time units that signal must be stable before the time that all other conditions are satisfied in order to get an accurate measurement. Defaults to zero.

num2 is the number of simulation time units that signal must be stable after the time that all other conditions are satisfied in order to get an accurate measurement. Defaults to zero.

list_item is the net name. There are two pre-generated net types, PO and PP, that represent all primary outputs and probe points, respectively.

When Command

Following the DEFINE PROBE statement is a series of WHEN statements that define the circuit states that must be found before a measurement can be taken. Multiple WHEN statements are executed sequentially—the simulator first monitors the circuit for the condition specified by the first WHEN statement and when it is satisfied, it begins monitoring for the second WHEN condition. If more than one condition must be satisfied during a single simulation time, a single WHEN statement should be coded with both conditions specified in the relational expression.

There are three basic types of WHEN statements: comparison, COUNT, and OFFSET. If executing a comparison, the simulator will continue simulation until the condition specified becomes true. At that point, the simulator begins execution of the next WHEN condition, if any. For a COUNT, the simulator will expect the condition to be satisfied the number of times specified by the COUNT keyword. The effect of this command is to delay the measurement a certain period of time or buffer the measurement for later observation. This is normally used to detect after a given number of clock pulses, but it is not restricted to this. The OFFSET is used to delay the measurement by a given number of simulation time units.

comparison:
WHEN (rel_expr) TAG(tag_name [, tag_name . . . ]);
where:
rel_expr is the relational expression defining some condition in the circuit that must be satisfied before the MEASURE can take place. The form of this expression is basically the same as on the IF statement except that values of R (rising transition) and F (falling transition) can be used. Multiple expressions can be grouped together with connector operators such as & and |. With & signifying the "and" operator and | signifying the "or" operator.

TAG(tag_name) denotes a construct that is used to supply programming data for the test environment. In the event that devices external to the printed circuit board (e.g., a logic analyzer) are serving as measurement devices in the test environment, it is crucial that these devices be set-up to match the simulation assumptions. Their probe measurement programming must match the logic probe programming that is used in the simulation. If this does not happen, then the test coverage and diagnostic information provided by the simulation will not be accurate. An effective way to ensure that the simulation and test environment probe programming match is to derive the test environment programming from an output of the simulator. The TAG keyword of the WHEN statement makes this possible.

When TAG is specified on the WHEN statement, each condition that is part of the WHEN may have an associated tag_name specified. This tag_name is then associated with the corresponding condition and both the tag_name and its condition are placed on the simulator's output results file. Post-processing programs that develop programming data for specific test environments make use of the tag_name to associate a given condition with the programming operation that is required by the test equipment. As an example, consider a logic analyzer attached to the address bus of a printed circuit board. In the simulation, a probe is defined with the following WHEN statement:

WHEN (ADDRBUS='FFFF0000'X) COUNT(2) TAG (TRIGGER_REG_A);

In the simulator's output results file the tag_name TRIGGER_REG_A will be associated with the condition ADDRBUS='FFFF0000'X. A test environment post-processing program can use this information and know that for the current probing operation the logic analyzer's TRIGGER_REG_A needs to be set to the value 'FFFF0000'X. Thus, by using data derived from the simulator output to drive the logic analyzer set-up, we can ensure that it will detect the same defects, if present, for this measurement that were predicted by the simulation.

Each tag_name can be 1–32 characters in length. When TAG is specified, there must be an entry in the associated tag_name list for each condition in the WHEN. Tag_names are associated positionally with condition, from left to right. A condition which does not need a tag_name may be represented by a null entry in the tag_name list (two successive commas). So if the WHEN statement is:

```
WHEN (NET1 = '1'B) & ((NET2 '10'B)
    (NET3 <> '0'B)) TAG (TAG1,,TAG3);
```

```
then
    TAG1 is associated with the comparison
    (NET1 = '1'B).
    (NET2 > '10'B) has no TAG.
    TAG3 is with (NET3 <> '0'B).
COUNT:
    WHEN (rel_expr) TAG(tag_name) COUNT(num);
``` where:
rel_expr is basically the same as above except that it is restricted to single nets. The value it is compared to should be a transition, but it is not limited to this.

tag_name See above. num is the number of times the condition specified by rel_expr must become satisfied, must be greater than zero if no buffering available. May be less than or equal to zero if buffering is available. The most likely use of this construct is to count clock edges and then examine buffered data based on this clock for errors at some time in the past (history trace) or future relative to the trigger.

```
OFFSET
    WHEN OFFSET(time_units) TAG(tag_name);
    where:
    time_units
        Number of simulation time units to wait before
        executing the next statement.
    tag_name
        See above.
END PROBE command
```

The END PROBE command marks the end of a DEFINE PROBE group. It may be preceded by a series of WHEN statements that must be satisfied prior to performing the measure on the nets listed in the DEFINE PROBE.

END PROBE;

Probe Command

The PROBE command is used to activate a DEFINE PROBE group, that is, it tells the simulator to begin monitoring the circuit for the conditions specified by the WHEN statements.

PROBE [ON | OFF] [ONE | CONT] probe_name [(list_item[,list_item . . . ])];
where:
ON | OFF specifies that monitoring for the specified logical probe should begin or be stopped. The default is ON.

ONE | CONT specifies whether once the conditions have been satisfied for a PROBE probe_name statement, measures taken for all the nets in list_items and any faults detected appropriately credited, whether the probe will be reactivated. Normally, this probe_name will not be reactivated until another PROBE statement is issued (i.e., the default option is ONE). However, if CONTinuous is specified, this probe_name will be reactivated and reinitialized (no WHEN conditions met) immediately after the time of the measure plus HOLD_time.

probe_name is the name as specified on the DEFINE PROBE command.

list_item is the same as for DEFINE PROBE. This list must be a subset of the nets listed in the DEFINE PROBE command. If omitted, all the nets specified in the DEFINE PROBE will be measured.

Thus, once the four WHEN conditions are satisfied, measures are taken on all LOG_NETS and a hold time of 25 units is validated.

An example of how these statements could be used to simulate a logic analyzer is shown below.

```
DEFINE LOG_NETS(5)
NET=(AA100AA10,AA100AB10,AA100AC10,AA100AD10);
DEFINE ADDRBUS(32)
NET=(AA200AA10(1),AA200AA10(2), . . . AA200AA10(32));
DEFINE DATABUS(32)
NET=(AA300AA10(1),AA300AA10(2), . . . AA300AA10(32));
DEFINE TRIGGER(1) NET=('ADL');
DEFINE CLOCK(1) NET=('SYSTEM CLOCK');
DEFINE LOG_ANALYZ PROBE HOLD(25) ATTACH_TO(LOG_NETS);
    WHEN((ADDRBUS='0010EA92'X) & (DATABUS=22))
    TAG(LOGADDR,TESTNUM);
    WHEN (ADDRBUS='00111AC0'X) TAG(TESTADDR);
    WHEN (TRIGGER='R'B) TAG(TRIGGER);
    WHEN (CLOCK='F'B) COUNT(10) TAG(COUNT);
END PROBE;
.
.
.
PROBE LOG_ANALYZ;
```

Thus, once the four WHEN conditions are satisfied, measures are taken on all FST_NETS delayed by an OFFSET of 15 time units, and a hold time of 25 units is validated.

An example of how these statements could be used to simulate the use of functional self test code is shown below.

```
DEFINE FST_NETS(5)
NET=(ZZ999AA10,ZZ999AB10,ZZ999AC10,ZZ999AD10,ZZ999AE10);
DEFINE DATABUS(32)
NET=(AA200AA10(1),AA200AA10(2), . . . AA200AA10(32));
DEFINE TRIGGER(1) NET=('ADL');
DEFINE FST1 PROBE HOLD(25) ATTACH_TO(FST_NETS);
    WHEN((ADDRBUS='001AC0'X) & (DATABUS=22))
    TAG(TESTADDR,TESTNUM);
    WHEN (ADDRBUS='00111AC0'X),TAG(TESTADDR);
    WHEN (TRIGGER='R'B) TAG(TRIGGER);
    WHEN OFFSET(15) TAG(OFFSET);
END PROBE;
.
.
.
PROBE FST1;
```

A PROBE statement should be used for FST code even if there is no physical probe involved. The DEFINE PROBE simulation control statement is intended as a general purpose means for establishing the points at which fault detection should occur and the conditions to be met that trigger the detection. More concisely, where and when faults are detected.

The logical probe may be connected to the microprocessor address and data bus or, perhaps, the I/O port dedicated to manufacturing test. In either case, the probe can be "programmed" to watch for a particular test number and a set of triggers. When these are satisfied, the simulator will sample all the probe detection nets, and determine what faults can be marked detected. In FIGS. 2–6, the time of this simulator measure is shown by the downwards vertical arrow labelled 31.

Notice that attaching a logical probe to internal nets assumes, without proof, that the measured fault effects on these nets will eventually manifest themselves to the test environment. If this is not the case, the detects are false, and the test coverage is wrong. The safest action is to put the probe on the manufacturing test port itself, since this is definitely visible to the test environment. In any case, the objective is that fault detection should occur at or near that point in the diagnostic program at which a branch is taken because a failure has been recognized.

Timing of Measurement Windows

The PROBE statements in the simulation control language determine when the simulator starts and ends the measurement window during which faults can be detected by the simulator. As much as possible, the conditions that control this window should match those in the test environment. The WHEN statement of the DEFINE PROBE group allows the user to indicate to the simulator the conditions necessary before a measurement can be taken. The following examples show how the WHEN statements can be used to specify different trigger conditions to the simulator.

Figure 2:
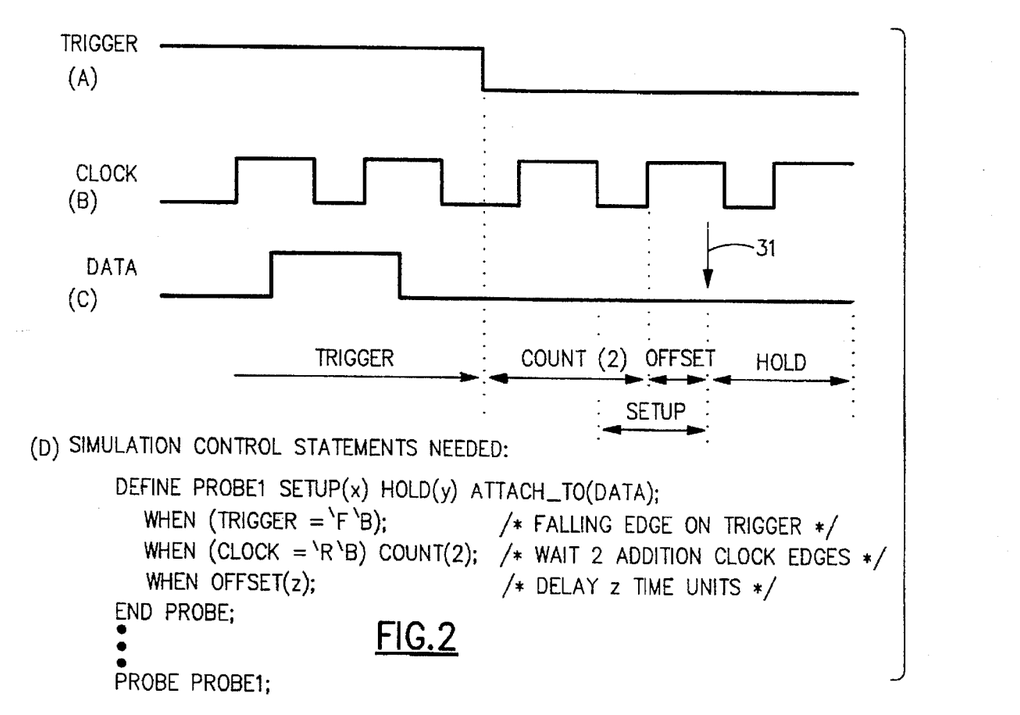
FIG. 2 shows trigger net, clock, and data net waveforms, respectively, on a common time scale, generated by the fault simulator and the simulation control statements using TRIGGER, COUNT, and OFFSET commands used to establish the measurement window shown in the waveforms.

Referring now to FIG. 2, the measure window for the net labelled data and shown in FIG. 2C is dependent on two conditions (available as logic analyzer features in manufacturing). The simulator will continue simulating until the trigger is detected. The net serving as the trigger is shown in FIG. 2A. After detecting the transition on the trigger net, it waits for two clock edges followed by the delay specified by the OFFSET. The simulator clock waveform is shown as FIG. 2B. Call this simulation time t. The simulator measures at time t, and also verifies that the signal is stable during the interval [t−x, t+y]. If it is not, then the SETUP time or HOLD time for measurement is violated, and a so-called "broken window" has occurred (see FIG. 5). The SETUP command verifies that the signal is stable in a time interval before the measurement and the HOLD command checks that the signal is stable in a time interval after the measurement. The simulation control statements needed to achieve the measurement window using TRIGGER, COUNT, and OFFSET functions shown in the waveforms of FIG. 2A, FIG. 2B, and FIG. 2C is shown in FIG. 2D.

Figure 3:
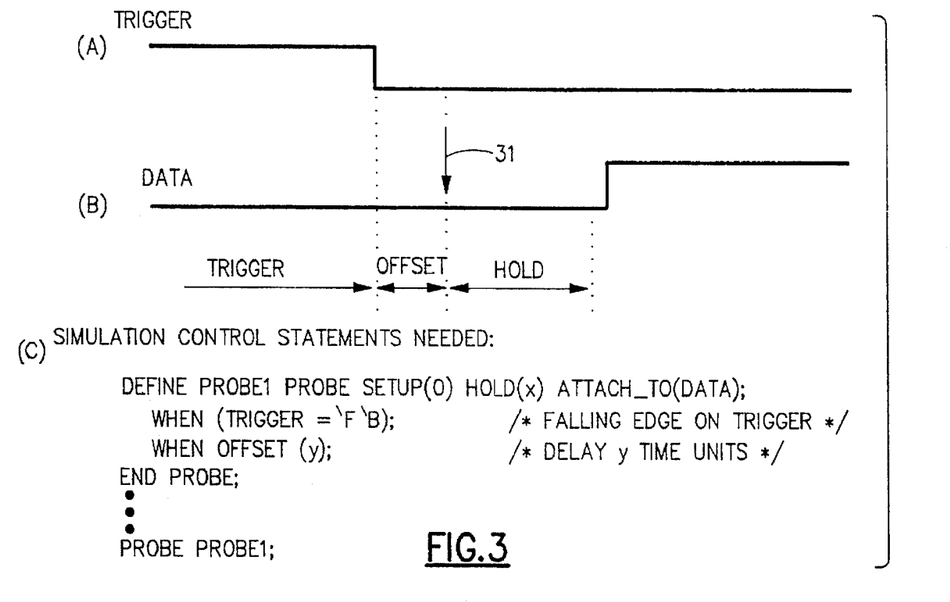
FIG. 3 shows trigger net and data net waveforms, respectively, on a common time scale, generated by the fault simulator and the simulation control statements using TRIGGER and OFFSET commands used to establish the measurement window shown in the waveforms.

Referring now to FIG. 3, another set of conditions is shown where the measurement is only dependent on the trigger net and SETUP time equals zero. The trigger net is shown in FIG. 3A, the data net to be measured is shown in FIG. 3B and the simulation control statements needed to make the measurement dependent on TRIGGER and OFFSET is shown in FIG. 3C.

Figure 4:
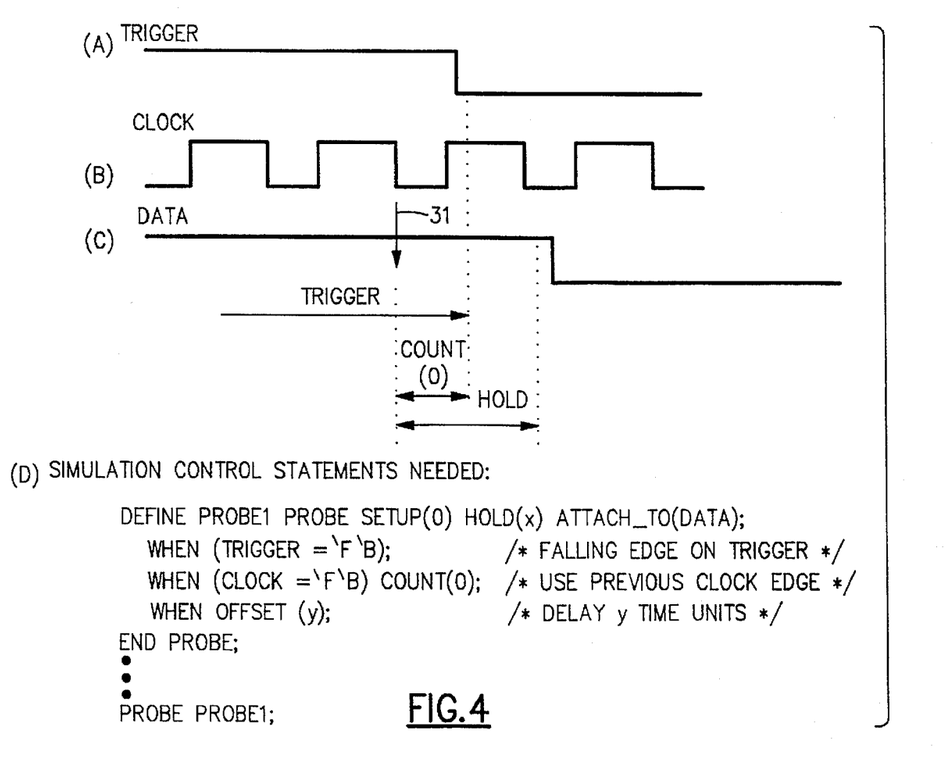
FIG. 4 shows trigger net, clock, and data net waveforms, respectively, on a common time scale, generated by the fault simulator and the simulation control statements using TRIGGER, CLOCK COUNT and OFFSET commands used to establish the measurement window shown in the waveforms.

A special situation occurs when a COUNT of less than or equal to zero is used with the WHEN statement in the simulation control language. For instance, COUNT (0) is used to indicate that the measurement window should open at the previous edge for the net specified (one buffer level). This is shown in FIG. 4 where FIG. 4A shows the waveform of the net used as the trigger net, FIG. 4B shows the waveform of the simulator clock signal, FIG. 4C is the data net which is to be measured and FIG. 4D is the simulation control statements needed to achieve the measurement window shown.

Figure 5:
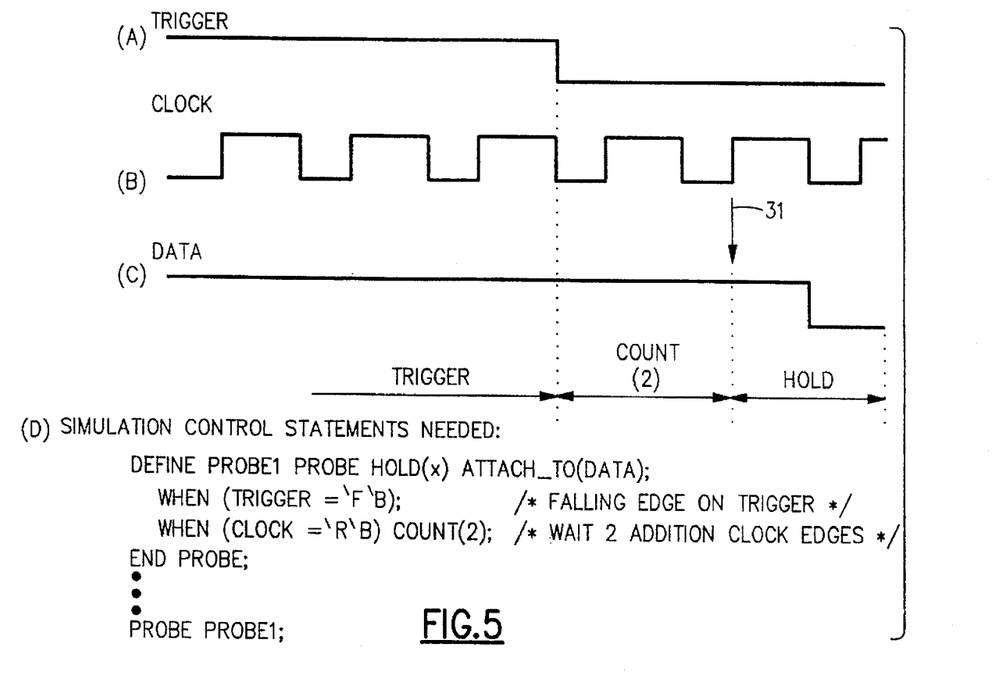
FIG. 5 shows trigger net, clock, and data net waveforms, respectively, on a common time scale, generated by the fault simulator and the simulation control statements using SETUP and HOLD time needed to establish the measurement window shown by the waveforms. An example of a broken window is depicted by the waveforms which occurs when the net being measured changes value during the measurement period.

The main purpose of SETUP time and HOLD time is to simulate the amount of time the net must remain stable for the test equipment to accurately capture its value. If the net changes value during the measurement window (this is known as a broken window), the simulator will change the measurement value to X since it is unable to determine which value will be seen. An example of a broken window is shown in FIG. 5. The data net waveform in FIG. 5C is seen to change value during the hold period which begins two clock edges, which are shown in the waveform of FIG. 5B, after the trigger net, shown in FIG. 5A, transitions from a high logical level to a low logic level.

Figure 6:
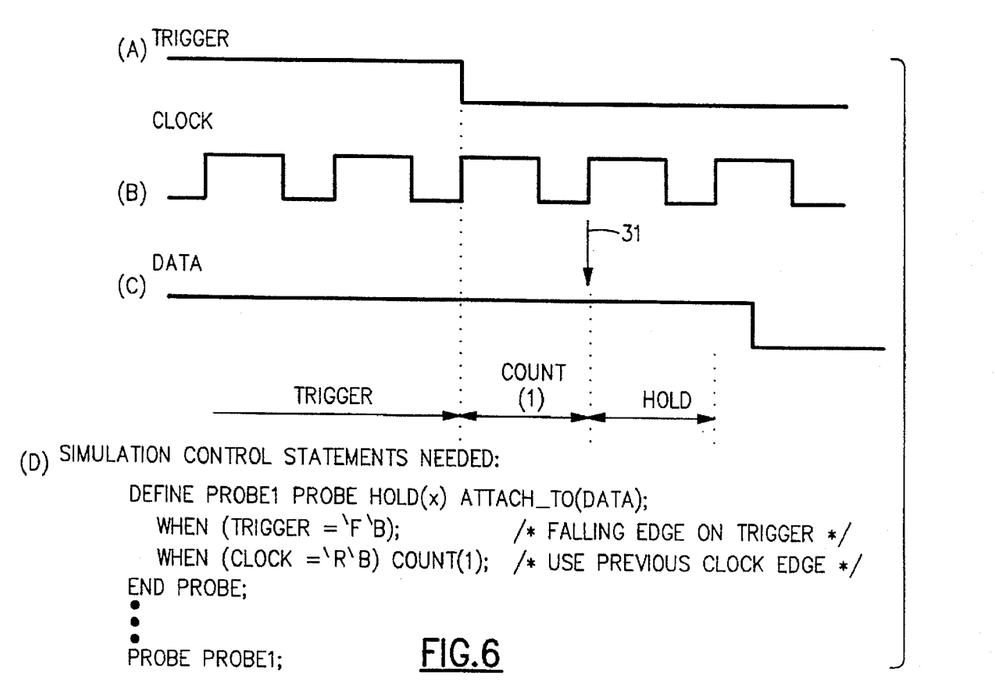
FIG. 6 shows trigger net, clock, and data net waveforms, respectively, on a common time scale, generated by the fault simulator and the simulation control statements using CLOCK and TRIGGER transition commands used to establish the measurement window shown in the waveforms.

Normally, the simulator will monitor for only a single WHEN condition at any time. When one WHEN condition is satisfied, the simulator immediately begins monitoring for the next one in the list. If two WHEN conditions are satisfied simultaneously, there is no problem unless the second condition has a COUNT associated with it. In this case, the simulator will begin the COUNT on the subsequent edge it detects, as shown in FIG. 6, where the trigger net is shown in FIG. 6A the simulator clock is shown in FIG. 6B, the data net to be measured is shown in FIG. 6C, and the simulation control statements having the two WHEN statements is shown in FIG. 6D.

Stored Pattern Test Support

Emulation of conventional stored pattern testing is still possible using the logical probe. Pattern application rate must be fixed by the user to not exceed the tester capability. Statements can be added to the test cases to inform the simulator when the tester can detect faults. Thus, the simulation control language must emulate the timing of the stimulus and detection. For example, given the following conditions, Tester rate is 400 nanoseconds.
Stimulus for Pin A gets applied at 100 nanoseconds into the tester cycle.
Faults can be detected on Pin B from 350 to 400 nanoseconds into the cycle.

The simulation control statements needed:

DEFINE A(1) NET=netname;
DEFINE B PROBE SETUP(0) HOLD(50) ATTACH_TO(PO);

-continued

Figures 7, 7A:
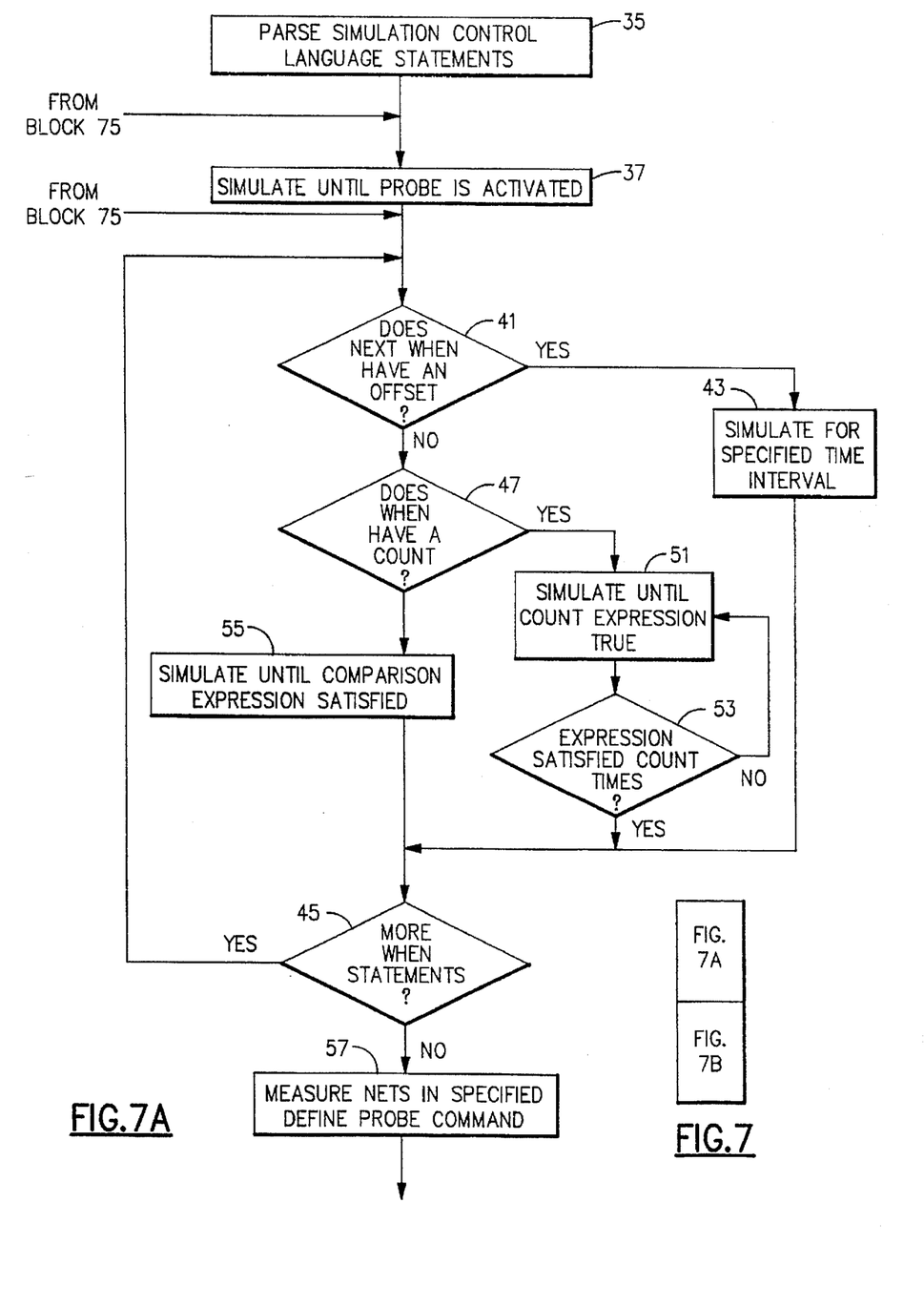
FIG. 7 relates FIGS. 7A and 7B, and shows a flow chart with the steps required to support the logical probe, which is used to specify where and when faults can be detected during the simulation.
Figure 7B:
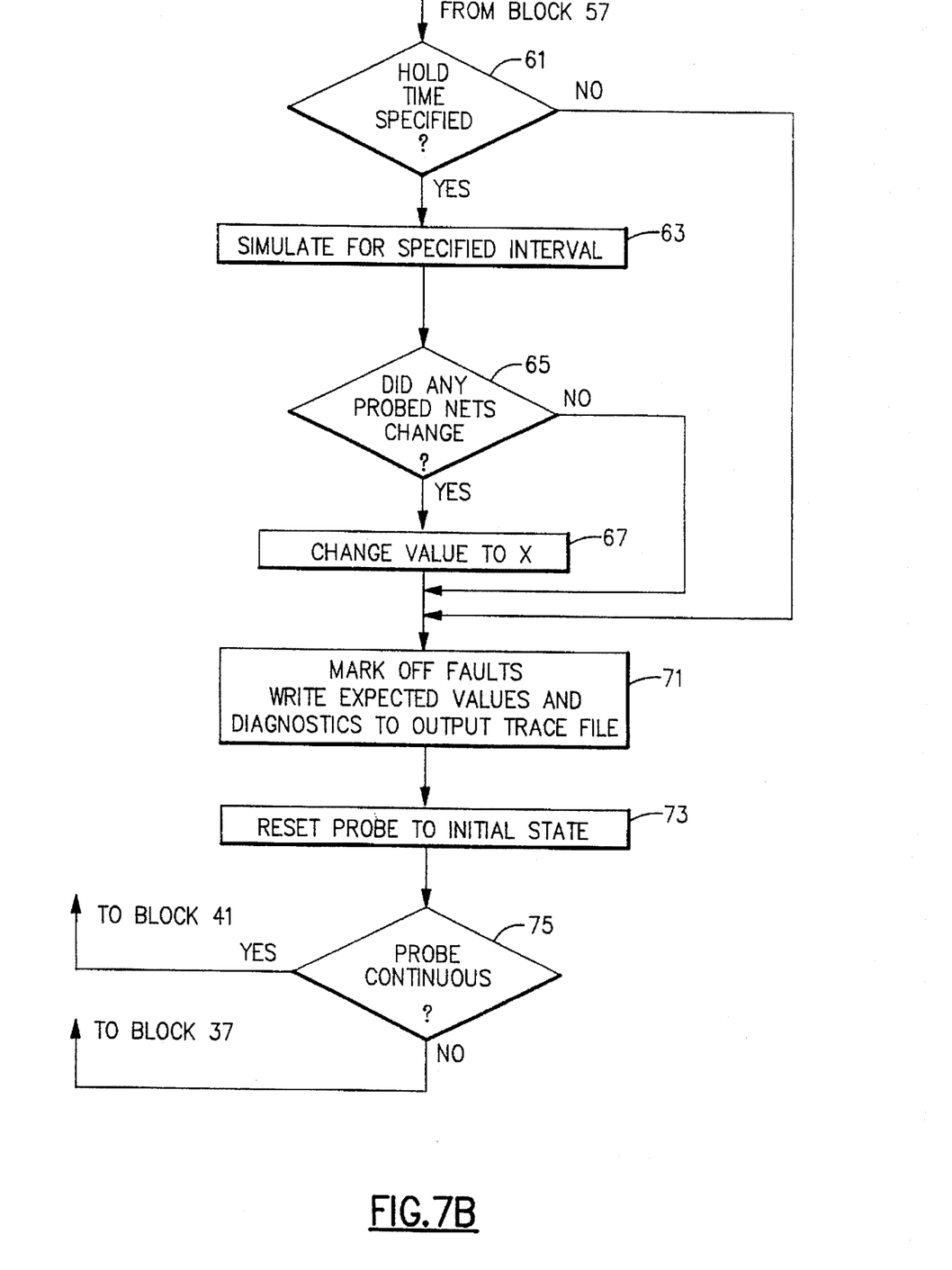

/*No trigger conditions - measure immediately and credit
   faults that are detected.    */
END PROBE;
/* Start of Tester Cycle 1    */
/100/ SET A='1'B;
/350/ PROBE B;
/* Start of Tester Cycle 2    */
/500/ SET A='0'B;
/750/ PROBE B;

Referring again to FIG. 1 and also to FIGS. 7A and 7B which show the steps required in flow chart form to support the logical probe, the probe definition is processed during initialization phase of the simulation and includes the DEFINE PROBE, WHEN and END PROBE statements. These statements are parsed in block 35 and the information specified in them is stored in internal tables in the simulator. The simulation is run until a PROBE command is reached which is used to activate a DEFINE PROBE group in block 37. The conditions associated with a probe definition are the WHEN clauses. The simulator includes a monitor function that is used to evaluate the WHEN conditions. This function will trigger an event when it detects a change in value on a specific net in the structure being simulated. When the event is triggered, control is turned back over to the test case manager 13 which can then determine if the value on the net meets the condition in the input. For example, a condition such as ADDRESS_BUS='FE00'X is executed by monitoring all the nets in the address bus. The simulator 11 calls the test case manager 13 when any of these nets change value and then determines if the value on the bus is equal to the address specified.

Figures 8, 8A:
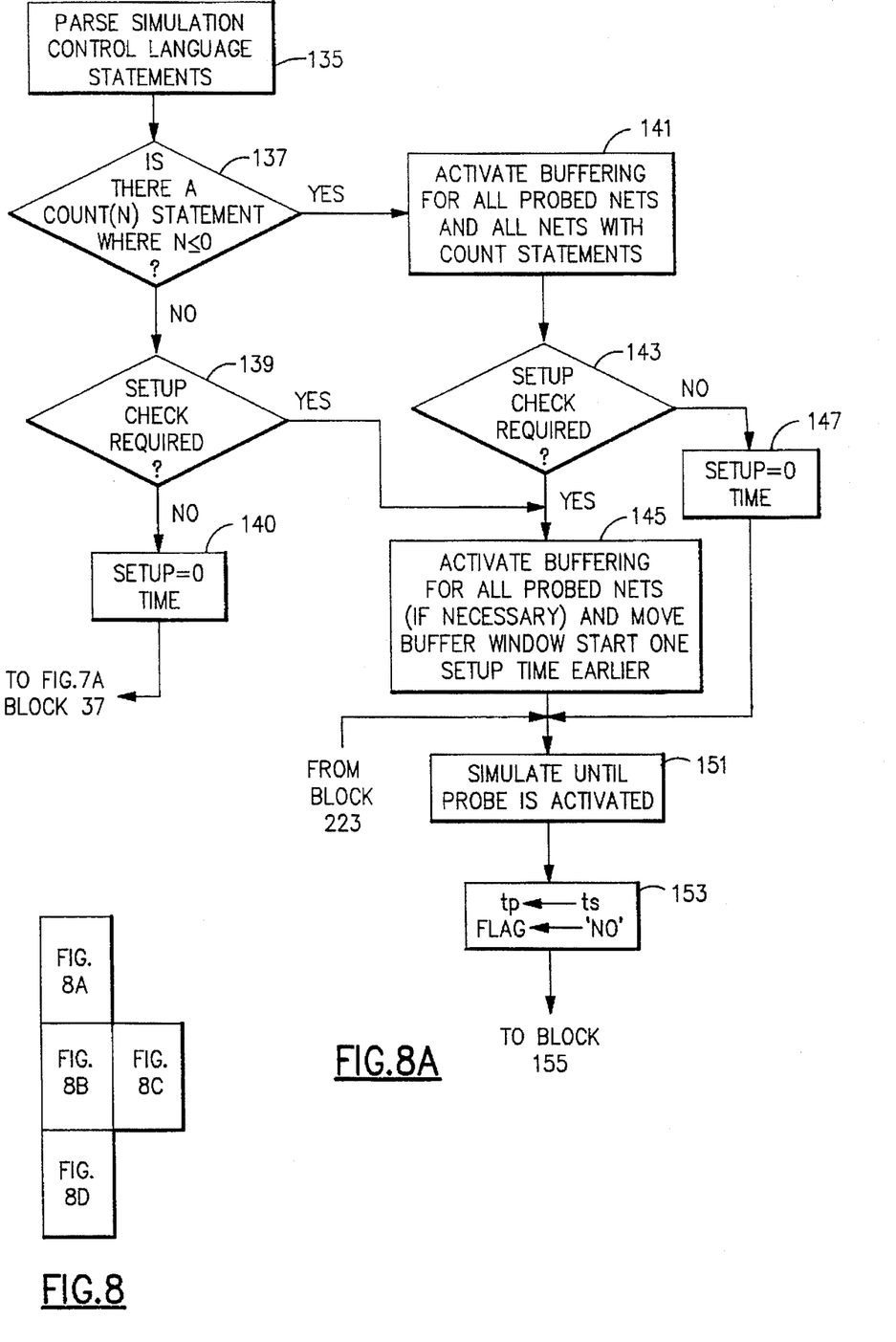
FIG. 8 relates FIGS. 8A, 8B, 8C, and 8D, and shows a flow chart with the steps required to support additional logical probe statements, which are used to specify where and when faults can be detected during the simulation.
Figure 8B:
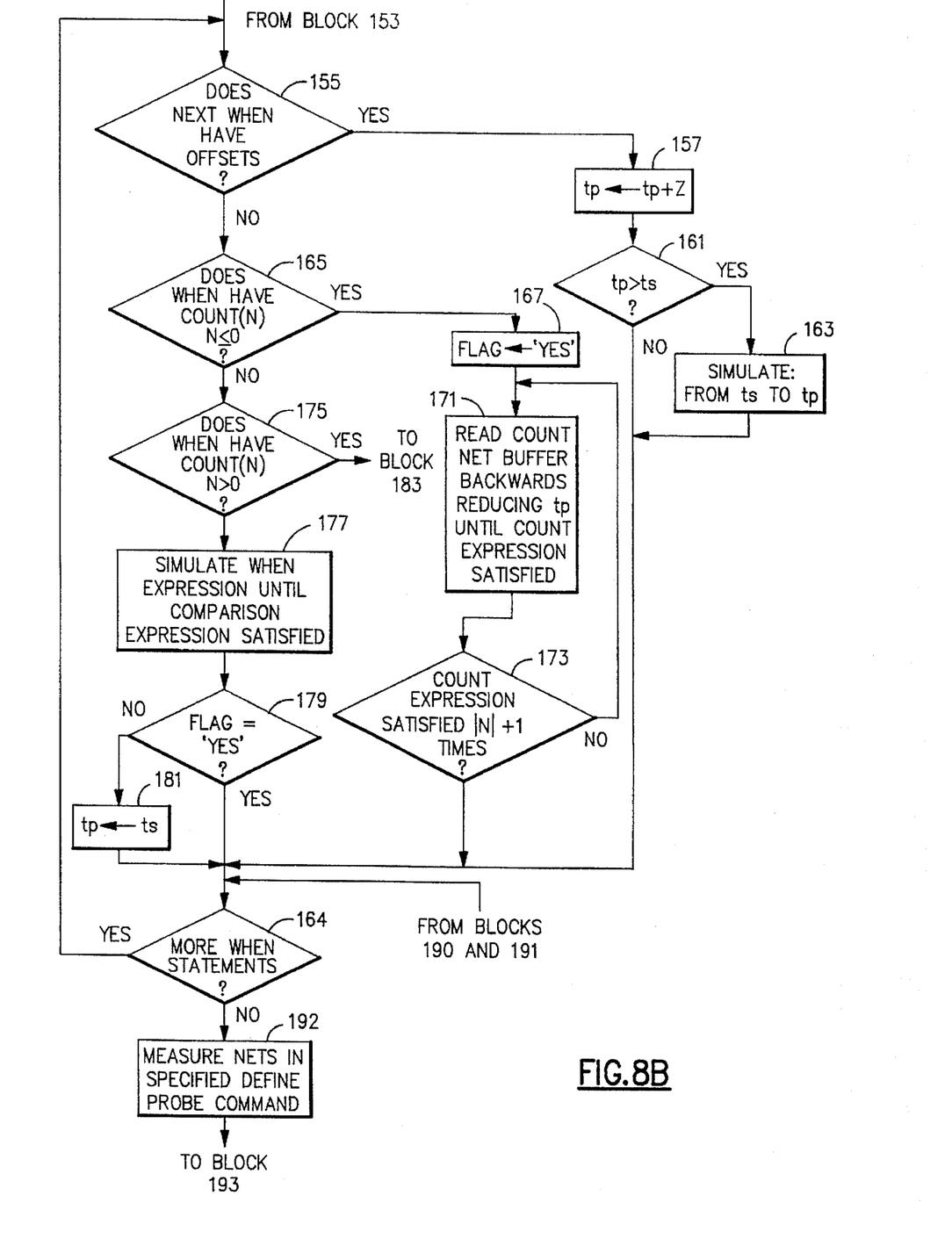
Figure 8C:
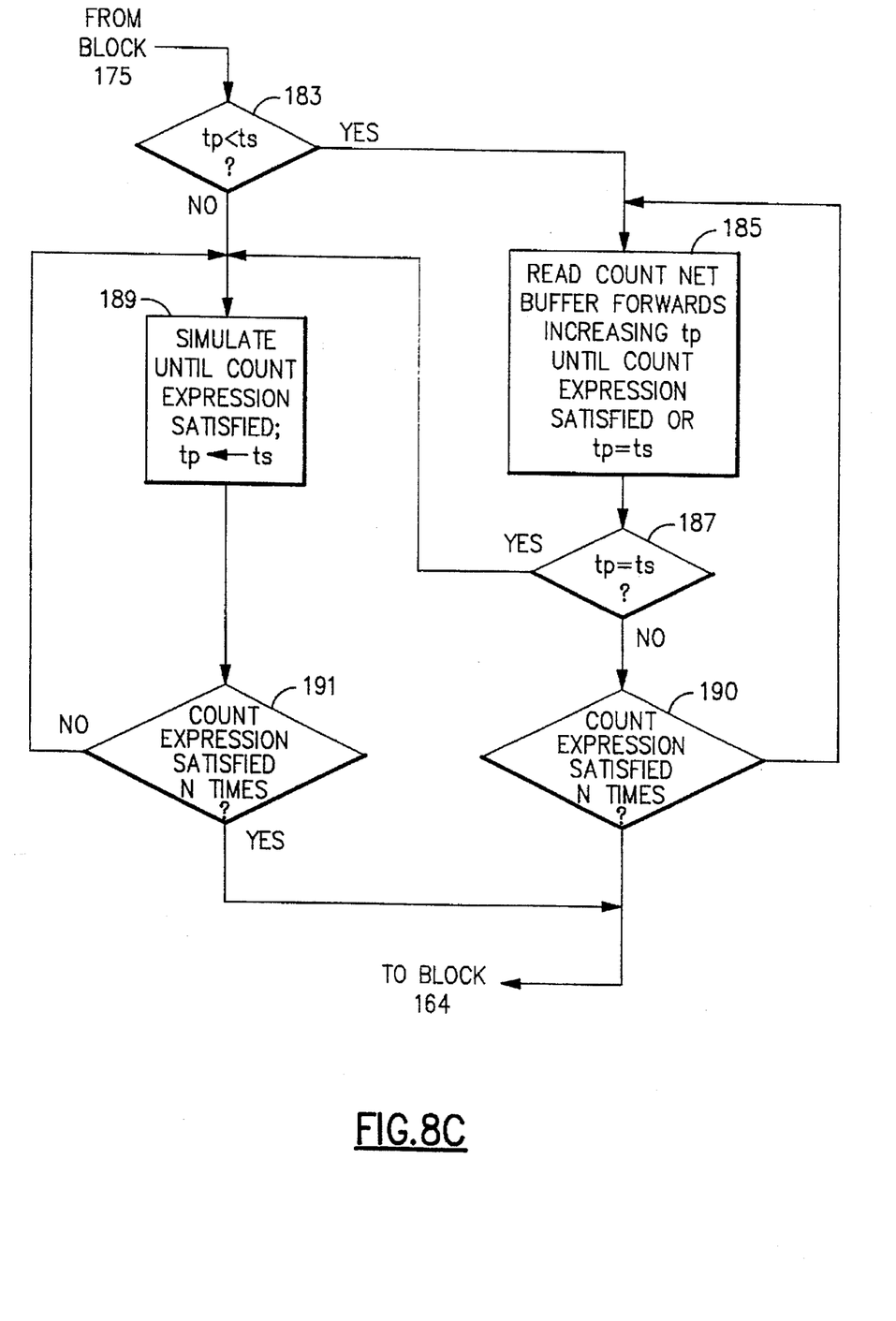
Figure 8D:
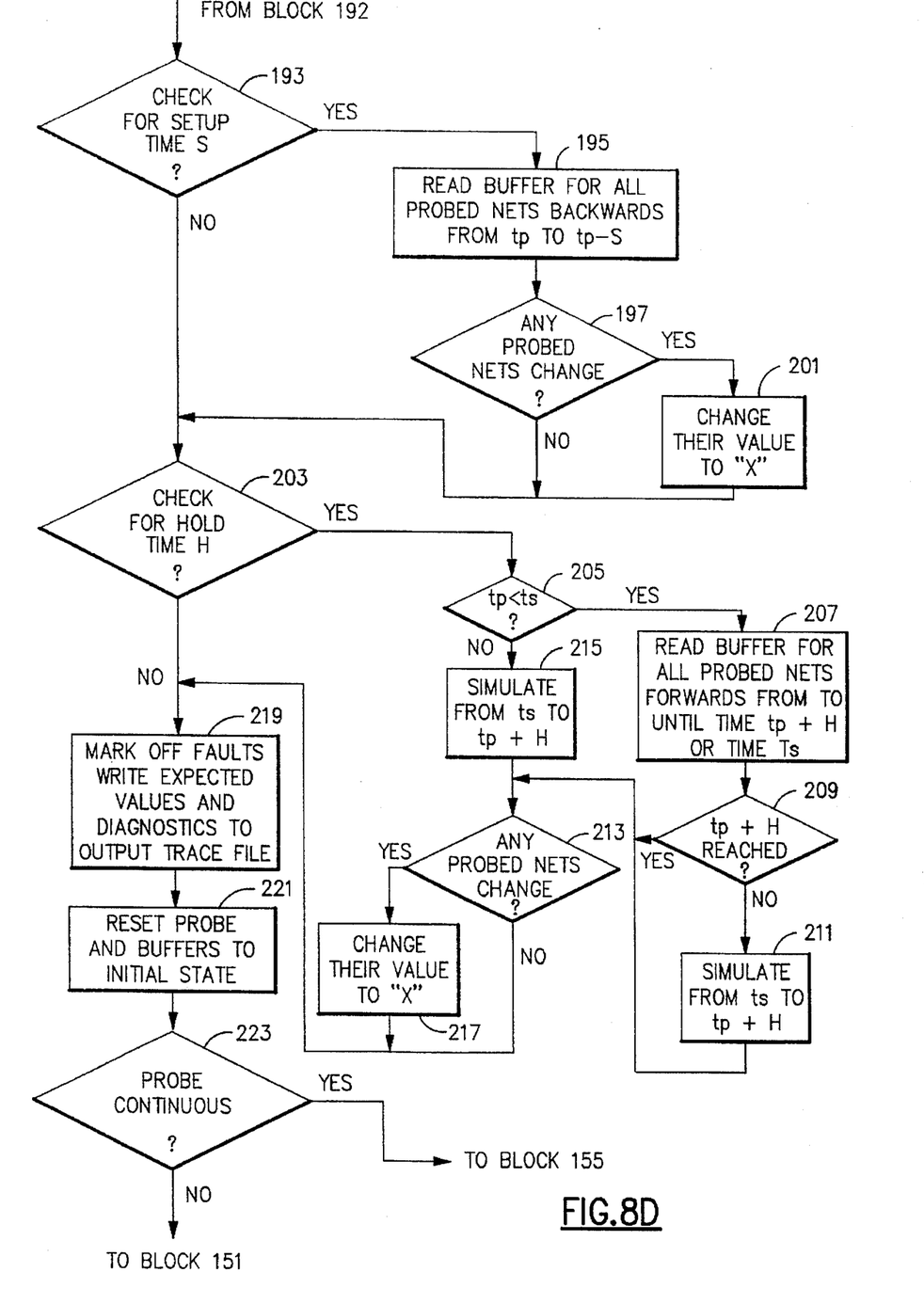

A determination of the basic type of WHEN statement comparison, COUNT, and OFFSET now needs to be made. The flow chart of FIG. 7 shows these decisions and is valid for all types with the exception of COUNT(num) statements where "num" is less that or equal to zero and SETUP statements. These cases are shown in the flow chart of FIG. 8, discussed hereinafter. In decision block 41, a determination is made whether the WHEN clause has an OFFSET. If yes, then in block 43 the measurement is delayed by a given number of simulation units. After the delay, decision block 45 is reached. If the WHEN command does not have a OFFSET then a check is made in decision block to determine if there is a COUNT in the WHEN statement. If the COUNT is present then the simulation continues until the COUNT condition is true in block 51. The number of times the condition is true is then compared to the number of times specified in the COUNT keyword in decision block 53. If the COUNT expression is satisfied then decision block 45 is reached. If the COUNT expression is not reached, then blocks 51 and 53 are repeated until decision block 53 is satisfied. If decision block 47 determines that the WHEN command does not have a COUNT then the simulation continues until the comparison specified in the WHEN command is satisfied as determined in block 55 and decision block 45 is reached. If there are more WHEN statements associated with the Probe which has been activated, as determined in decision block 45, then the sequence of blocks starting with block 41 is repeated for the remaining WHEN statements.

Next, the nets specified in the DEFINE PROBE COMMAND are measured for fault-free and fault conditions in block 57. In decision block 61, a determination of whether a HOLD time is specified in the DEFINE PROBE command is made. If there is a HOLD time, then the simulation continues for the specified interval in block 63 and in decision block 65 a determination is made whether any of the probed nets changed value. If there was a change in value, then the measured value for the net and the fault being simulated is recorded as an "X" in block 67, signifying that the value is unknown. In block 71, the faults are marked off by recording the expected value for each of the measured nets, which is the value measured during the fault-free portion of the simulation, and the measured value during each of the fault conditions for each of the nets for each of the fault conditions, if it differed from the fault-free condition. The information is sent to a trace file where it is available in table form. The first line of entries in the table is the fault-free values measured for each of the nodes. The next line of entries are all the values that were measured at each of the nodes for the first fault condition simulated that differed from the expected value. The next line is for the next fault condition measured and the values which differed from the expected values. The table will also contain the X values, if any were found.

If there is no HOLD time as determined in decision block 61, then the faults are marked off in block 71 as just described except there will be no X values due to "broken windows" (hold time violations). The table shows which fault conditions can be detected at which nets using which trigger conditions. The PROBE is reset to its initial state in block 73. A check is made in decision block 75 to determine if the PROBE command is continuous. If the PROBE command is continuous then the type of probe statement is again determined beginning in block 41 and upon the conditions specified in the WHEN command being met, the measurements of the nets are again made. If the PROBE command is not continuous, as determined in decision block 75 then the simulation continues as specified in block 37 until another PROBE is activated.

Referring now to FIGS. 8A, 8B, 8C, and 8D, another embodiment of the present invention is shown in which COUNT statements of less than or equal to zero, and SETUP statements are also supported. The probe definition is processed during initialization phase of the simulation and includes the DEFINE PROBE, WHEN and END PROBE statements. These statements are parsed in block 135 and the information specified in them is stored in internal tables in the simulator. A check is then made in decision block 137 to see if there is a COUNT statement having a keyword of less than or equal to zero. If COUNT statements having keywords less than or equal to zero are not found, then a check is made in decision block 139 to see if a SETUP check is required. If not, then SETUP is set equal to zero in block 140. When neither COUNT statements having keywords of less than or equal to zero nor SETUP statements are present, then the logical probe statements are supported by the steps shown in the flow chart of FIGS. 7A and 7B. If there is a COUNT statement with a keyword of less than or equal to zero, as determined in decision block 137, then buffering is required. Buffering is activated for all PROBED nets and all nets with COUNT statements in block 141, with buffering requirements resolved into buffer windows.

All appropriate nets are buffered throughout the probe active period. This is done for simplification purposes, at the cost of buffer memory. Alternatively, the amount of buffering needed for each net could be determined and a sliding window used to reduce the memory required. A check is made in decision block 143 to see if a SETUP statement is used in addition to the COUNT statement with a a keyword of less than or equal zero.

If a yes decision is reached in decision block 143 then buffering is activated, if it has not already been activated in block 141, for a COUNT statement with a keyword of less than or equal to zero, and the buffer window start is moved one setup time earlier to accommodate the SETUP keyword. If a setup check is not required in decision block 143, then the setup time is set equal to zero in block 147. The simulation is run after block 145 and 147, in block 151, with the simulation time designated as $t_S$ which increases as the simulation proceeds. The probe measurement time is designated as $t_p$, which is set equal to the simulation time and a flag is set to 'NO' in block 153, to indicate that a COUNT statement having a keyword of less than or equal to zero has not yet been reached. A check is made in decision block 155 to see if the next WHEN statement has an OFFSET statement. If yes, then the probe measurement time is moved later by the amount of the offset in block 157. A check is made in decision block 161 to see if additional simulation time is needed to reach the probe measurement time because of the offset. If yes, the simulation continues in block 163 until the probe measure time is reached. Decision block 164 is reached after block 163 and is also reached if a no response occurs in decision block 161.

If no OFFSET command was found in decision block 155, then a check is made for a COUNT statement having a keyword of less than or equal to one in decision block 165. If a yes decision is reached in block 155, then the flag is set to 'YES' in block 167 and the count net buffer is read backwards until the COUNT statement comparison in the WHEN statement is satisfied one time in block 171. A check is made in decision block 173 to see if the COUNT keyword is satisfied by checking the absolute value of the COUNT keyword plus one, if no, then the block 171 is repeated. Thus for a COUNT keyword of zero, the count net buffer is read backwards until the comparison in the WHEN expression is satisfied one time and if the COUNT keyword is −1 then the COUNT buffer is read backwards until the comparison in the WHEN statement is satisfied twice. When decision block 173 is satisfied, decision block 164 is reached. A check is made in decision block 175 to see if there is a COUNT statement with a keyword greater than zero. Decision block 175 is reached from decision block 165 if the WHEN statement does not have a COUNT statement with a keyword of less than or equal to zero. If a no decision is reached in block 174, the WHEN statement is simulated until the comparison expression is satisfied in block 177. A check is made in decision block 179 to see if the flag has been set to 'YES'. If the flag is set to 'YES' then the probe measurement is required in the past. Therefore, the probe time should not move with the simulation time and block 164 is reached. If the flag has not been set to 'YES' then the probe time is set equal to the simulation time in block 181 and then to block 164. If there is a COUNT statement with a keyword of greater than zero, then a check is made in decision block 183 to see if probe time is less than the simulation time. If yes, then a previous WHEN statement must have had a zero or negative keyword. The COUNT net buffer is read forward increasing t until the comparison in the WHEN expression is satisfied one time or $t_p$ equals $t_s$. If $t_p$ equals $t_s$ then more simulation is needed and this occurs in block 189. If $t_p$ does not equal $t_s$ then a check is made to see if the count expression has been satisfied the specified number of times. If not, block 185 is repeated. If yes, block 164 is reached. If $t_p$ is less than $t_s$, or $t_p$ is determined to equal $t_s$ in decision block 190, then the simulation continues in block 189 until the count comparison in the WHEN statement is satisfied one time. The probe time is the same value as simulation time. A check is made in decision block to see if the COUNT expression has been satisfied the number of times specified in the COUNT keyword. If not, then the simulation is continued in block 189. If yes, then block 164 is reached. In decision block 164 a check is made to see if there are any more WHEN statements. If yes, then the program returns to decision block 155. If there are no more WHEN statements, the nets in the define probe command are measured in block 192.

After block 192, a check is made to see if there are any SETUP commands in decision block 193. If there are, then the buffer for all probed nets are read backwards from $t_p$ to $t_p-S$ where S is the keyword used with the SETUP statement. If any of the probed nets changed, as determined by decision block 197, then the value of the nets is changed to "X" in block 201 and then decision block 203 is reached. If none of the values changed or there are no SETUP commands, then decision block 203 is reached where a check is made to see if there are any HOLD statements. If there are, then a check is made in decision block 203 to determine if the probe time is less than the simulation time.

If yes, then a previous WHEN statement had a zero or negative count. The buffer for all probed nets is read forward from time $t_p+H$, where H is the hold time, or until $t_p$ equals $t_s$, whichever comes first. If $t_p$ equals $t_s$ then more simulation is needed and this occurs in block 189. If $t_p+H$ is not reached as determined in decision block 209 the simulation is continued in block 211 until $t_s$ reaches $t_p+H$. When $t_p+H$ is reached, either in decision block 209 or block 211 then a check is made in decision block 213 to see if any of the probed nets have changed value. If $t_p$ is less than $t_s$, as determined in decision block 205, then the simulation continues until $t_s$ reaches $t_s+H$, since $t_p=t_s$. Decision block 213 then checks if any probed nets have changed. If yes then their value is changed to "X". The next step is to mark off faults in block 219 and to write expected values and diagnostics to an output trace file. The probe is reset and the buffers reset to their initial state. A check is then made in decision block 223 to see if the probe is continuous. If it is then decision block 155 is again reached. If the probe is not continuous then block 151 is reached which continues the simulation until a probe is activated.

Figure 9:
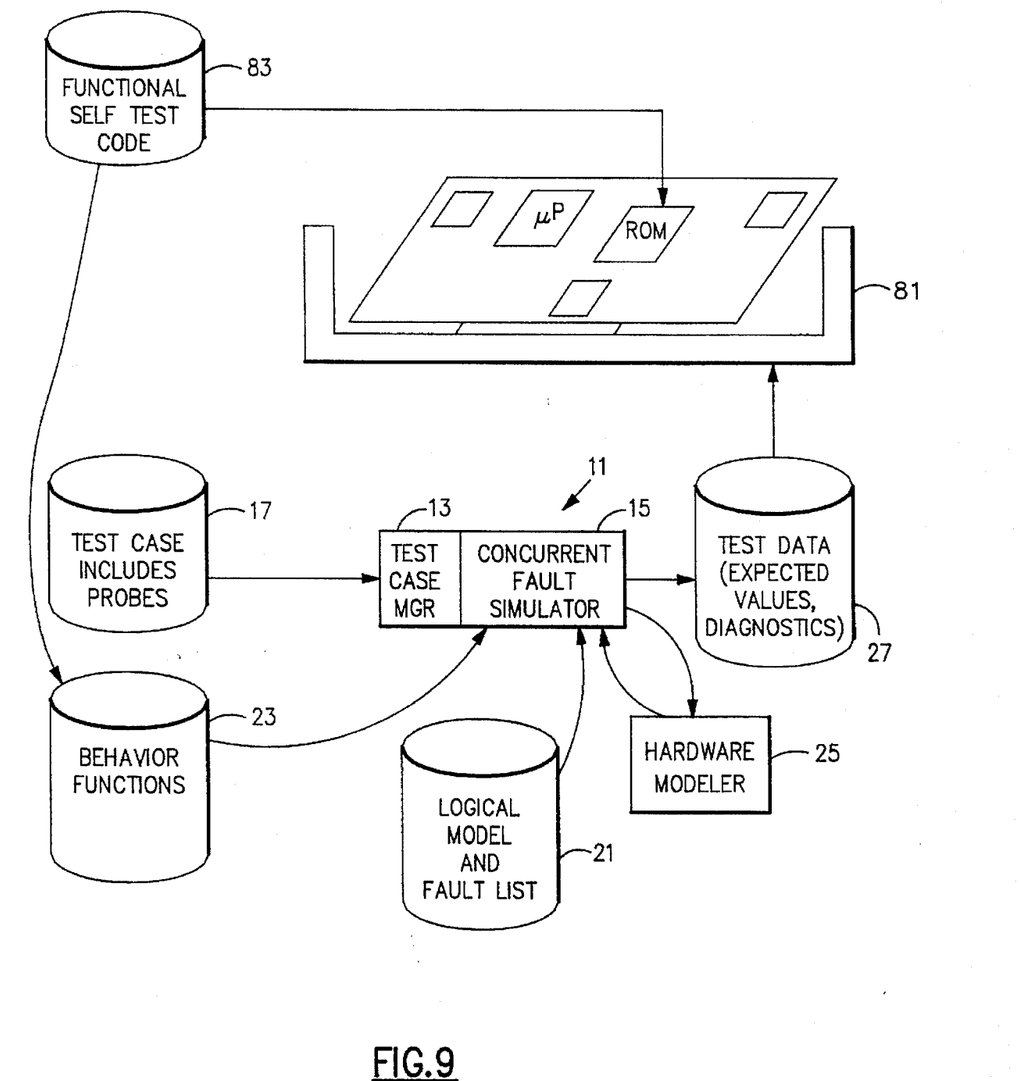
FIG. 9 shows the flow of information from the simulator to the test fixture.

Referring now to FIG. 9, the flow of information from the simulator 11 to a test fixture 81 is shown. Test fixture refers to the general structure supported by the tester. The test fixture includes the circuits under test as well as additional circuits and test instruments that establish the required test detection and diagnostic capabilities to match the circuits under test expected operating or system environment. The FST code 83 that is simulated after testing is used and any necessary modification used as part of the circuit for testing the circuit after manufacture and to provide self test every time the circuit is started. The tables in the trace file 27 allow a determination to be made as to the percent of the faults simulated that can be detected. The output of the simulator can provide diagnostic information to allow field correction of problem components based on test information obtained. The information generated in the tables in the trace file allow the measurements of accessible nets to be compared to the values obtained under the different fault conditions to help diagnose the faulty board.

The foregoing has described apparatus and a method for determining the effectiveness of test instruments, including devices external to the circuits under test such as logic analyzers and digital testers as well as devices contained in the circuits under test such as functional self-test code using fault simulation.

While the invention has been particularly shown and described with reference to a preferred embodiment thereof, it will be understood by those skilled in the art that various changes in form and details may be made therein without departing from the spirit and scope of the invention.

We claim:

1. A method of simulating detection of faults in a digital circuit comprising the steps of:

defining a logical probe for nets to be measured, for conditions to be satisfied before a measurement of the nets can be made, and for providing a duration of a time-limited measurement window during which said measurement takes place;

simulating operation of the circuit for fault-free and faulty operation;

monitoring for a satisfaction of the defined conditions to be satisfied before measurement can be made;

measuring net values for the nets to be measured upon the satisfaction of the defined conditions during fault-free and faulty operation of the circuit; and recording a fault-free value and a list of faults which can be detected.

2. The method of claim 1 further comprising the steps of detecting changes in a net value during the measurement window and recording any indication of change of value together with a corresponding fault being simulated.

3. The method of claim 1 further comprising the step of creating data from the logical probe for use in programming devices in a test environment to ensure that similar defects, if present, will be detected in the test environment as predicted by the simulation.

4. A method of simulating detection of faults in a digital circuit having functional self test code run by a processor in the circuit comprising the steps of:

defining a logical probe for nets to be measured, for conditions to be satisfied before a measurement of the nets can be made, and for providing a duration of a time-limited measurement window during which said measurement takes place;

simulating operation of the circuit including operation of the self test code for fault-free and a plurality of fault conditions;

monitoring for a satisfaction of the defined conditions to be satisfied before measurement can be made;

measuring values for the nets to be measured upon the satisfaction of the defined conditions during fault-free and faulty operation of the circuit;

comparing a fault-free net value to the net values measured for each of the faults simulated; recording the fault-free value; and recording values different from the fault-free value together with a corresponding fault.

5. The method of claim 4 further comprising the steps of detecting changes in the net value during the measurement window and recording any indication of change of value together with a corresponding fault being simulated.

6. Apparatus for simulating detection of faults in a digital circuit comprising:

simulator means for simulating circuit operation during fault-free and faulty operation;

means for defining a logical probe for nets to be measured, for conditions to be satisfied before a measurement of the nets can be made, and for providing a duration of a time-limited measurement window during which said measurement takes place;

means for monitoring for a satisfaction of the defined conditions to be satisfied before measurement can be made;

means for measuring values for the nets to be measured upon the satisfaction of the defined conditions during fault-free and faulty operation of the circuit; and means for recording a fault-free value and a list of faults which can be detected.

7. The apparatus of claim 6 further comprising means for creating data from the logical probe for use in programming devices in a test environment to ensure that similar defects, if present, will be detected in the test environment as predicted by the simulation.

8. Apparatus for simulating detection of faults in a digital circuit having functional self test code run by a processor in the circuit comprising the steps of:

means for defining a logical probe for nets to be measured, for conditions to be satisfied before a measurement of the nets can be made, and for providing a duration of a time-limited measurement window during which said measurement takes place;

means for simulating operation of the circuit including operation of the self test code for fault-free and a plurality of fault conditions;

means for monitoring a satisfaction of the defined conditions to be satisfied before measurement can be made;

means for measuring values of the nets upon the satisfaction of the defined conditions during fault-free and faulty operation of the circuit;

means for comparing a fault-free net value to the net values measured for each of the faults simulated;

means for recording the fault-free value; and means for recording values different from the fault-free value together with a corresponding fault.

* * * * *